(12) United States Patent
Dabral

(10) Patent No.: US 10,714,425 B2
(45) Date of Patent: Jul. 14, 2020

(54) FLEXIBLE SYSTEM INTEGRATION TO IMPROVE THERMAL PROPERTIES

(71) Applicant: Apple Inc., Cupertino, CA (US)

(72) Inventor: Sanjay Dabral, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 299 days.

(21) Appl. No.: 15/263,632

(22) Filed: Sep. 13, 2016

(65) Prior Publication Data
US 2018/0076112 A1 Mar. 15, 2018

(51) Int. Cl.
| | |
|---|---|
| H01L 23/367 | (2006.01) |
| H01L 23/34 | (2006.01) |
| H01L 25/065 | (2006.01) |
| H01L 23/538 | (2006.01) |
| H01L 23/427 | (2006.01) |
| H01L 23/28 | (2006.01) |

(Continued)

(52) U.S. Cl.
CPC .......... *H01L 23/5385* (2013.01); *H01L 23/13* (2013.01); *H01L 23/28* (2013.01); *H01L 23/427* (2013.01); *H01L 25/0652* (2013.01); *H01L 24/08* (2013.01); *H01L 24/13* (2013.01); *H01L 24/16* (2013.01); *H01L 24/17* (2013.01); *H01L 24/80* (2013.01); *H01L 2224/08145* (2013.01); *H01L 2224/131* (2013.01); *H01L 2224/16145* (2013.01); *H01L 2224/16227* (2013.01); *H01L 2224/80895* (2013.01); *H01L 2224/80896* (2013.01); *H01L 2924/12041* (2013.01); *H01L 2924/12044* (2013.01); *H01L 2924/1431* (2013.01); *H01L 2924/1432* (2013.01); *H01L 2924/1434* (2013.01); *H01L 2924/15311* (2013.01); *H01L 2924/15312* (2013.01)

(58) Field of Classification Search
CPC .................................................... H01L 23/373
See application file for complete search history.

(56) References Cited

U.S. PATENT DOCUMENTS 6,245,617 B1 * 6/2001 Yang ................... H01L 21/3145
257/E21.269
8,604,603 B2  12/2013 Lau et al.
(Continued)

*Primary Examiner* — Julio J Maldonado
*Assistant Examiner* — Omar F Mojaddedi
(74) *Attorney, Agent, or Firm* — Kowert, Hood, Munyon, Rankin & Goetzel, P.C.; Lawrence J. Merkel

(57) ABSTRACT

In an embodiment, an interposer includes multiple integrated circuits coupled thereto. The integrated circuits may include processors and non-processor functionality that may have previously been integrated with the processors on an SOC. By separating the functionality into multiple integrated circuits, the integrated circuits may be arranged on the interposer to spread out the potentially high power ICs and lower power ICs, interleaving them. In other embodiments, instances of the integrated circuits (e.g. processors) from different manufacturing process conditions may be selected to allow a mix of high performance, high power density integrated circuits and lower performance, low power density integrated circuits. In an embodiment, a phase change material may be in contact with the integrated circuits, providing a local reservoir to absorb heat. In an embodiment, a battery or display components may increase thermal mass and allow longer optimal performance state operation.

19 Claims, 4 Drawing Sheets

(51) Int. Cl.
*H01L 23/13* (2006.01)
*H01L 23/00* (2006.01)

(56) References Cited

U.S. PATENT DOCUMENTS

| | | | |
|---|---|---|---|
| 8,861,198 B1* | 10/2014 | Asuncion | G06F 1/1658 |
| | | | 361/679.3 |
| 9,040,349 B2 | 5/2015 | Kelly et al. | |
| 9,076,754 B2 | 7/2015 | Hung et al. | |
| 9,257,364 B2 | 2/2016 | Ahuja et al. | |
| 2010/0315570 A1* | 12/2010 | Mathew | G06F 1/1637 |
| | | | 349/58 |
| 2012/0105400 A1* | 5/2012 | Mathew | H04N 5/2251 |
| | | | 345/207 |
| 2014/0153193 A1* | 6/2014 | Engelhardt | F28D 15/00 |
| | | | 361/720 |
| 2015/0035134 A1* | 2/2015 | Hung | H01L 23/3675 |
| | | | 257/712 |
| 2015/0108628 A1* | 4/2015 | Yu | H01L 23/42 |
| | | | 257/712 |
| 2016/0232127 A1* | 8/2016 | Potkonjak | G06F 1/329 |
| 2017/0062383 A1* | 3/2017 | Yee | H01L 25/0652 |

\* cited by examiner

FLEXIBLE SYSTEM INTEGRATION TO IMPROVE THERMAL PROPERTIES

BACKGROUND

Technical Field

Embodiments described herein are related to electronic devices and the integrated circuits used therein.

Description of the Related Art

Over time, more functionality has been integrated into system on a chip (SOC) integrated circuits (ICs). The increasing integration permits smaller device form factors, and in some cases improved power efficiency. However, the shrinking of so much functionality onto one SOC die also has drawbacks. For example, when the SOC is operating in a high performance mode (high power supply voltage and high clock frequency), a significant amount of heat can be generated in a very small area. Removing the heat can be challenging. Particularly, in a handheld device, heat removal is complicated by a lack of cooling fans and other air-circulation mechanisms typically used in laptops, desktops, and servers. Heat removal is further complicated by the fact that heat buildup is very noticeable in a hand held device, and can be uncomfortable for the user.

The difficulties in removing heat can also limit the amount of time that the SOC (or portions of the SOC, such as the processors) can operate in the highest performance states. Continuous operation at the high performance state generates significant heat, and thus the performance state is typically exited after a short period of time to allow the heat to dissipate before thermal limits are exceeded. Additionally, keeping the SOC powered up for computation incurs a number of overhead factors that consume power (e.g. the phase locked loop (PLL) that generates clocks in the SOC, various general purpose I/O pins and other serializer/deserializer (SERDES) links remain active, etc. So, keeping the SOC powered up for long periods of time in a lower performance state, with higher power overhead may be less efficient than "sprinting:" Operating at high performance/power state (or "optimal" power/performance state) for short periods of time to complete tasks, and then entering low power modes as quickly as possible to save power.

SUMMARY

In an embodiment, an apparatus comprises an interposer to which multiple integrated circuits are coupled. The ICs may include processors (e.g. graphics processing units (GPUs), central processing units (CPUs), etc.). Other ICs may include portions of non-processor functionality that may have previously been integrated with the processors on an SOC and/or other chips/devices such as field programmable gate arrays (FPGAs) and/or analog ICs. With the separation of the SOC functionality into multiple into ICs, the ICs may be arranged on the interposer to spread out the potentially high power ICs (e.g. processors) and lower power ICs, interleaving the low power ICs with the high power ICs, in some embodiments. Thus, the heat may be generated over a larger area and may be more readily dissipated, in some embodiments. The effective thermal mass around such "hot spots" may increase, slowing the temperature rise during operation at more optimal power/performance states and thus allowing longer operation in such states. Such implementations may be effective, e.g., in cases where the high power ICs are computationally-intensive power consumers like processors, as compared to communication-intensive power consumers.

In other embodiments, instances of the integrated circuits (e.g. processors) manufactured under different manufacturing process conditions may be selected for a given interposer to allow a mix of high performance, high leakage integrated circuits and lower performance, low leakage integrated circuits. Overall power consumption may be lower than a single chip SOC solution, as each component may be optimized for its task. For example a large SRAM cache in a high performance process may have a relatively large static leakage, whereas another leakage-optimized SRAM may be a more optimal choice in a given embodiment, or alternative memory may be used (e.g. embedded DRAM or DRAM). In a given manufacturing process, leakage current (also known as $I_{off}$) and active current ($I_{on}$) are related by a ratio. Thus, high performance circuits may generally have higher leakage currents in idle state, unless power gated or the power supply voltage magnitude is reduced. In an embodiment, a phase change material may cover the plurality of integrated circuits and/or may be placed to the side of the integrated circuits, providing a local thermal reservoir reducing peak transient temperature. If covering the components, either high conductivity thermal paths are provided, or the PCM may be loaded with thermal conducting materials.

In some embodiments, the above effects may permit the ICs to operate in higher performance state for longer, since the heat generated may be more readily dissipated. Even though the area consumed by the interposer may be greater than a corresponding single chip SOC, the performance of the overall system may be better. Such embodiments may be helpful to systems with intermittent high performance needs, which may generate rapid local heat changes for a short period of time. The PCM may absorb this heat, and if operating the system in short higher performance states results in improved system energy relative to operating the system in lower performance states for longer times, an overall energy efficiency may be gained.

In some embodiments, the interposer is coupled to a main logic board (MLB) which is formed on a light guide for a display screen of the device that includes the interposer. This configuration may reduce the height of the overall assembly, in an embodiment. Additionally, yield may be improved over a single SOC solution, since a defective IC can be discarded before assembly on the interposer, whereas the single SOC would be discarded for any defect in any of the integrated functionality.

BRIEF DESCRIPTION OF THE DRAWINGS

The following detailed description makes reference to the accompanying drawings, which are now briefly described.

Figure 1:
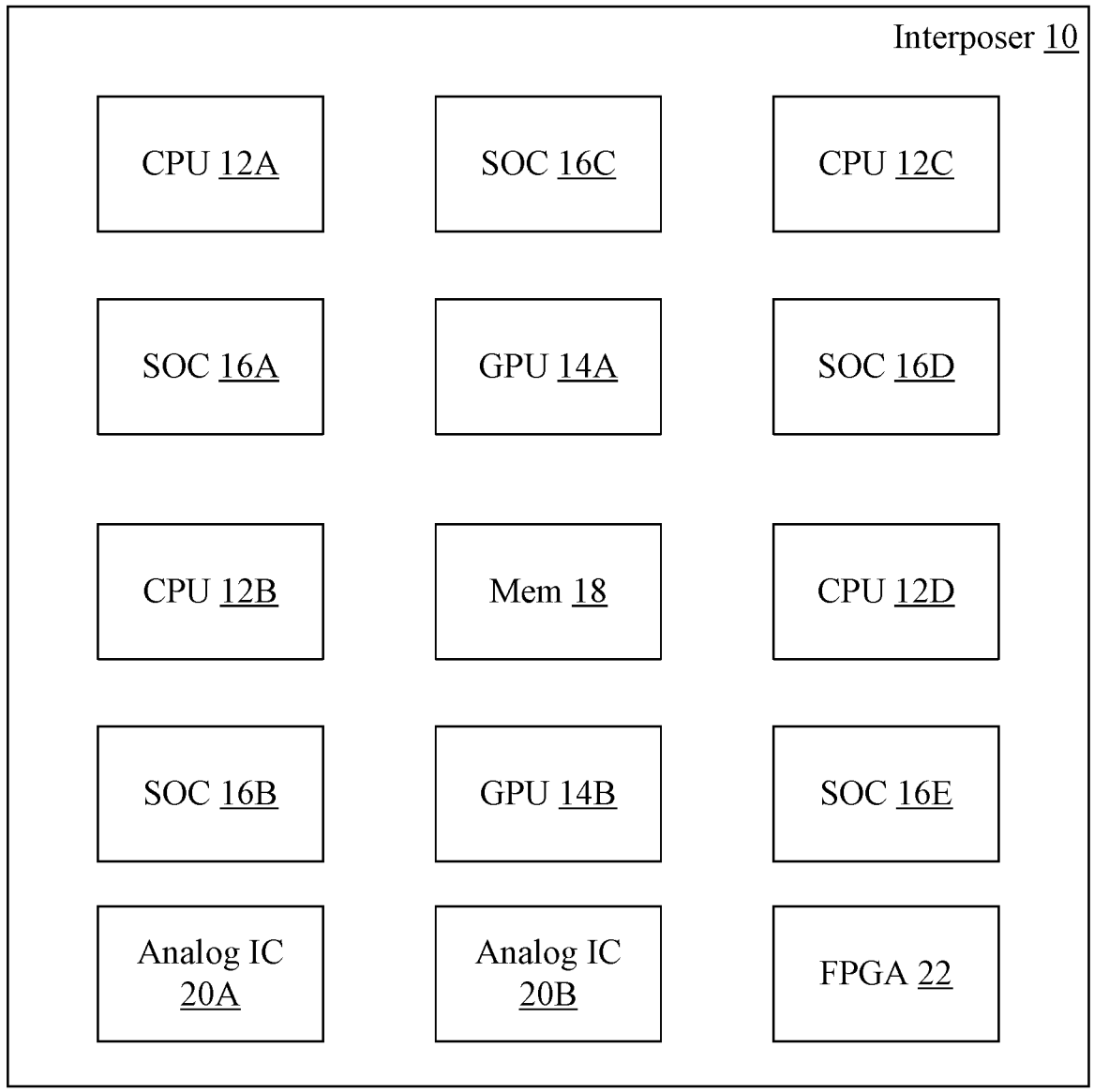
FIG. 1 is a block diagram of one embodiment of integrated circuits attached to an interposer.

While embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "clock circuit configured to generate an output clock signal" is intended to cover, for example, a circuit that performs this function during operation, even if the circuit in question is not currently being used (e.g., power is not connected to it). Thus, an entity described or recited as "configured to" perform some task refers to something physical, such as a device, circuit, memory storing program instructions executable to implement the task, etc. This phrase is not used herein to refer to something intangible. In general, the circuitry that forms the structure corresponding to "configured to" may include hardware circuits. The hardware circuits may include any combination of combinatorial logic circuitry, clocked storage devices such as flops, registers, latches, etc., finite state machines, memory such as static random access memory or embedded dynamic random access memory, custom designed circuitry, analog circuitry, programmable logic arrays, etc. Similarly, various units/circuits/components may be described as performing a task or tasks, for convenience in the description. Such descriptions should be interpreted as including the phrase "configured to."

The term "configured to" is not intended to mean "configurable to." An unprogrammed FPGA, for example, would not be considered to be "configured to" perform some specific function, although it may be "configurable to" perform that function. After appropriate programming, the FPGA may then be configured to perform that function.

Reciting in the appended claims a unit/circuit/component or other structure that is configured to perform one or more tasks is expressly intended not to invoke 35 U.S.C. § 112(f) interpretation for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

In an embodiment, hardware circuits in accordance with this disclosure may be implemented by coding the description of the circuit in a hardware description language (HDL) such as Verilog or VHDL. The HDL description may be synthesized against a library of cells designed for a given integrated circuit fabrication technology, and may be modified for timing, power, and other reasons to result in a final design database that may be transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and may further include other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA.

As used herein, the term "based on" or "dependent on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

This specification includes references to various embodiments, to indicate that the present disclosure is not intended to refer to one particular implementation, but rather a range of embodiments that fall within the spirit of the present disclosure, including the appended claims. Particular features, structures, or characteristics may be combined in any suitable manner consistent with this disclosure.

DETAILED DESCRIPTION OF EMBODIMENTS

Turning now to FIG. 1, a block diagram of one embodiment of an interposer 10 is shown with various integrated circuits attached to a surface thereof. In the illustrated embodiment, the integrated circuits include CPUs 12A-12D, GPUs 14A-14B, various other portions of an SOC in discrete ICs 16A-16E, a memory 18, one or more analog ICs 20A-20B, and one or more FPGAs 22. The memory 18 may be an integrated circuit as well, or may be multiple integrated circuits in a stack, in various embodiments.

The CPUs 12A-12D and GPUs 14A-14B may generally be capable of significantly higher power consumption, at least in some performance states, than other ones of the integrated circuits 16A-16E and 18. Generally, processors of various types may be capable of higher power consumption than other integrated circuit components. The higher-power-consuming components (e.g. CPUs 12A-12D and GPUs 14A-14B) may physically spaced out over the surface of the interposer 10, locating the high heat generating sources away from each other to allow more area to conduct heat away from the assembly shown in FIG. 1. In an embodiment, the higher-power-consuming components (e.g. CPUs 12A-12D and GPUs 14A-14B) may be spaced apart on the interposer 10 to reduce power density. In some embodiments, a thermal mass such as phase change material (described in more detail below) may be inserted in the space. In still other embodiments, the higher-power-consuming components (e.g. CPUs 12A-12D and GPUs 14A-14B) may be interleaved with the lower-power-consuming components (e.g. SOC portions 16A-16E and/or memory 18), allowing the higher-power-consuming components to be physically separated while using the intervening distance to attach other ICs to the interposer 10. Viewed in another way, the power consumption density may be spread over a larger area in the embodiment of FIG. 1 (as compared to a single IC SOC), e.g. over the surface of the interposer 10. As noted above, such embodiments may be effective for computationally-intensive power consumers such as processors, where increased distance for communication (which may increase communication power consumption) is not a significant factor. In some embodiments, if communication power is significant, local caches may be used to reduce the communication overhead. Some ICs may be more amenable to local cache solutions than others, so a cost-benefit analysis may be performed to determine if local caches should be added. Additionally, the interposer 10 may provide thermal mass close to the heat-generating ICs.

Each integrated circuit 12A-12D, 14A-14B, 16A-16E, 18, 20A-20B, and 22 may be a separate semiconductor die (or stacked dice, e.g. in the case of the memory 18). In other embodiments, one or more high performance die may be stacked with a lower performance die/circuit block. For example, a high performance CPU may be stacked with a cache, or a CPU may be stacked with a MPIC. In an embodiment, one or more of the integrated circuits 12A-12D, 14A-14B, 16A-16E, and 18 may be manufactured under different process conditions than other ones of the dice. Thus, one or more dice may be higher performance than other dice. However, higher performance dice also tend to have higher leakage current (current consumed by transistors when the transistors are not actually actively conducting current, such as when the gate to source voltage of a complementary metal-oxide-semiconductor (CMOS) transistor is less than the threshold voltage of the transistor). Different mixes of die having different leakage currents may be employed to optimize an instance of the assembly for a particular end device. For example, a low power, hand held device may use a larger mix of low leakage current, lower performance die and while a higher power, desktop or tablet device may use a larger mix of high leakage current, high performance die. As another example, for a tablet device, the combination of different power/performance level dies may ensure a tighter total power distribution (and smaller power variance) than a monolithic SOC die, whose power variance may be larger and the highest power part may set the limit.

The leakage current measured from a given integrated circuit may be one example of a device characteristic that may be used to indicate the performance level of an integrated circuit. The integrated circuits may be "binned" at one or more thresholds of leakage current. While high and low leakage current devices are used as an example herein, various embodiments may have more than two levels of leakage current to separate devices. Still other embodiments may use one or more additional device characteristics or other device characteristics to indicate performance and power consumption (e.g. maximum operating frequency at a given voltage, etc.). Similarly, active current in the given integrated circuit may be measured to bin devices, where higher active current may be correlated to higher performance (and higher power consumption).

In an embodiment, one or more of the CPUs 12A-12D may be high leakage current dice and remaining CPUs 12A-12D may be low leakage current dice. The use of some high leakage current dice and some lower leakage current dice may provide a lower "average power" for the system than a single SOC (which would have all CPUs at the essentially the same leakage current level). In some cases, it may be possible to assign demanding applications to the high performance, high leakage current dice while less performance-sensitive applications may be assigned to lower performance, low leakage current dice. A similar division of GPUs 14A-14B may be made, and workload may be assigned accordingly.

The CPUs 12A-12D may be processors implementing any general purpose instruction set architecture. The GPUs 14A-14B may similarly be processors implementing any graphics instruction set. The processors may generally include any desired performance-enhancing circuitry, as desired (e.g. caches, out of order execution, speculative execution, superscalar execution, branch prediction, prefetching, register renaming, pipelining, etc.). The processors may also be implementations that do not implement one or more of the above performance-enhancing circuits. In some embodiments, a mix of different types of processors may be used (e.g. high performance CPUs, power efficient (somewhat lower performance) CPUs, media processors (audio, video, etc.) having different operation, power/performance density, and timing. That is, some tasks may consume small amounts of CPU/GPU performance, and may be handled on a media processor. The various ICs may be arranged so that processors that are active at different times are place near each other, lower average power density of the area occupied by those processors, in some embodiments.

The portions of the SOC 16A-16E may implement other system circuitry (e.g. memory controller, audio and/or video processing circuitry, peripheral interfaces, peripherals, etc.). Any combination of non-CPU, non-GPU system circuitry may be included in the SOC ICs 16A-16E.

The memory 18 may be any type of semiconductor memory (e.g. random access memory (RAM) such as static RAM (SRAM), dynamic RAM (DRAM), non-volatile RAM (NVRAM), etc.). In an embodiment, the memory 18 may be a stack of multiple DRAM die. Particular, in some embodiments, the DRAM may be synchronous DRAM (SDRAM) such as double data rate (DDR) SDRAM, including DDR SDRAM that is optimized for mobile devices.

The analog ICs 20A-20B may implement various analog circuitry (e.g. radio frequency chips such as cell communication chips, WiFi chips, etc.). The FPGAs 22 may be provided for configurable logic support.

The interposer 10 may be any type of package to which multiple integrated circuits may be affixed. For example, the interposer 10 may be a silicon interposer, a redistribution layer, a ceramic, organic, or printed-circuit-board-like substrate, a multi-chip module, etc. In some embodiments, the interposer 10 may include active devices as well.

It is noted that the number of the various integrated circuits 12A-12D, 14A-14B, 16A-16E, 18, 20A-20B, and 22 is merely exemplary and any combination of numbers of the various integrated circuits may be used in various embodiments.

Figure 2:
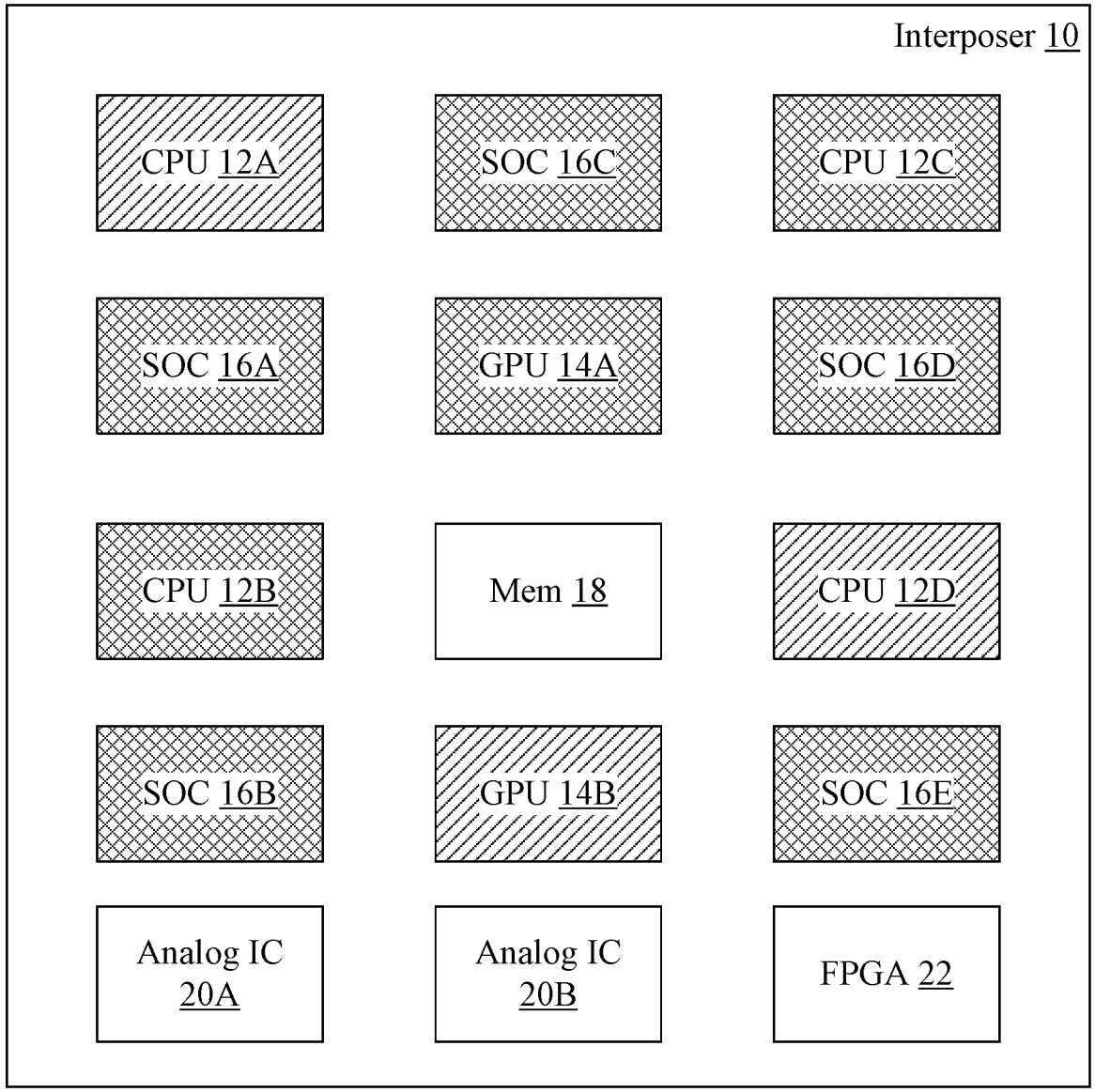
FIG. 2 is a block diagram of one embodiment of FIG. 1 illustrating a first mix of integrated circuits.

FIG. 2 is an embodiment of the interposer 10 and integrated circuits 12A-12D, 14A-14B, 16A-16E, and 18, using shading on the integrated circuits 12A-12D, 14A-14B, and 16A-16E to indicate which circuits are low leakage current, low performance ICs and which are high leakage current, high performance ICs. Thus, in the embodiment of FIG. 2, the CPUs 12A and 12D, and the GPU 14, are high performance, high leakage ICs and the remaining components are low performance, low leakage ICs. The mix of integrated circuits in the embodiment of FIG. 2 may be appropriate for a low power device such as a hand held electronics device (e.g. cell phone, personal digital assistant, etc.). Also, the arrangement of ICs places the high performance, high leakage current ICs relatively far from one another, aiding heat dissipation by increasing the area over which the heat is generated (e.g. reducing the power consumption density by spreading it over the surface of the interposer 10). That is, the low leakage current ICs may be arranged in proximity to a high leakage current IC, or interleaved between the high leakage current ICs. Additionally, in some embodiments, high leakage current, high performance ICs that are lower in power density that other ICs (e.g. a cache) may be interleaved with higher power density ICs. Still further, ICs may be located adjacent/near other ICs that are often not powered on fully at the same time. The effect in the various cases may be to lower the overall power density to more evenly balance thermal density.

Figure 3:
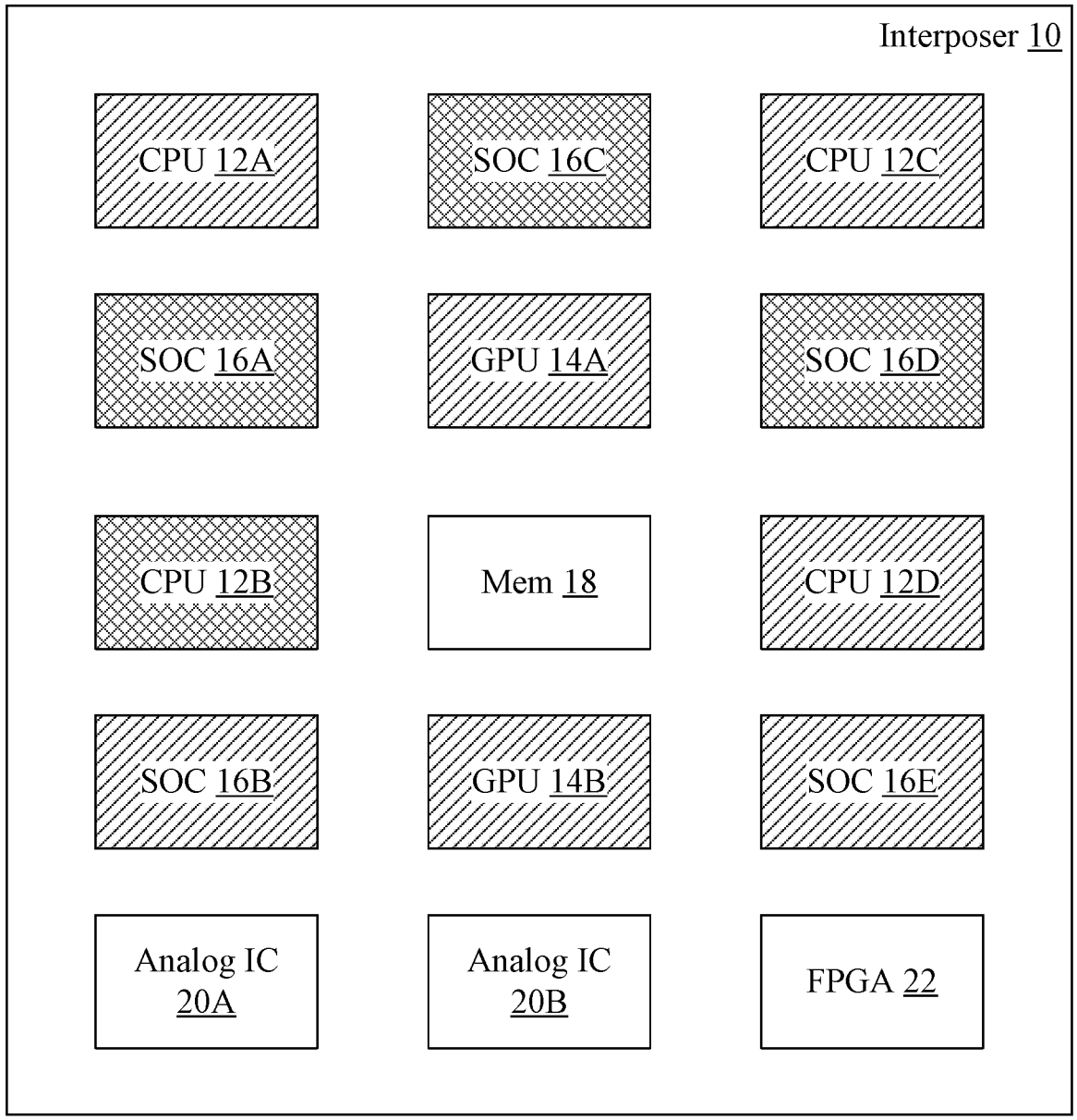
FIG. 3 is a block diagram of one embodiment of FIG. 1 illustrating a second mix of integrated circuits.

FIG. 3, on the other hand, is an embodiment of the interposer 10 and integrated circuits 12A-12D, 14A-14B, 16A-16E, and 18 that may be appropriate for a higher performance, higher power device. In the embodiment of FIG. 3, the CPUs 12A, 12C, and 12D, the GPUs 14A-14B, and the SOC portions 16B and 16E are high performance, high leakage ICs and the remaining components are low performance, low leakage current ICs. As can be seen comparing FIGS. 2 and 3, higher number of high leakage, high performance integrated circuits are included in the embodiment of FIG. 3 than the embodiment of FIG. 2.

Figure 4:
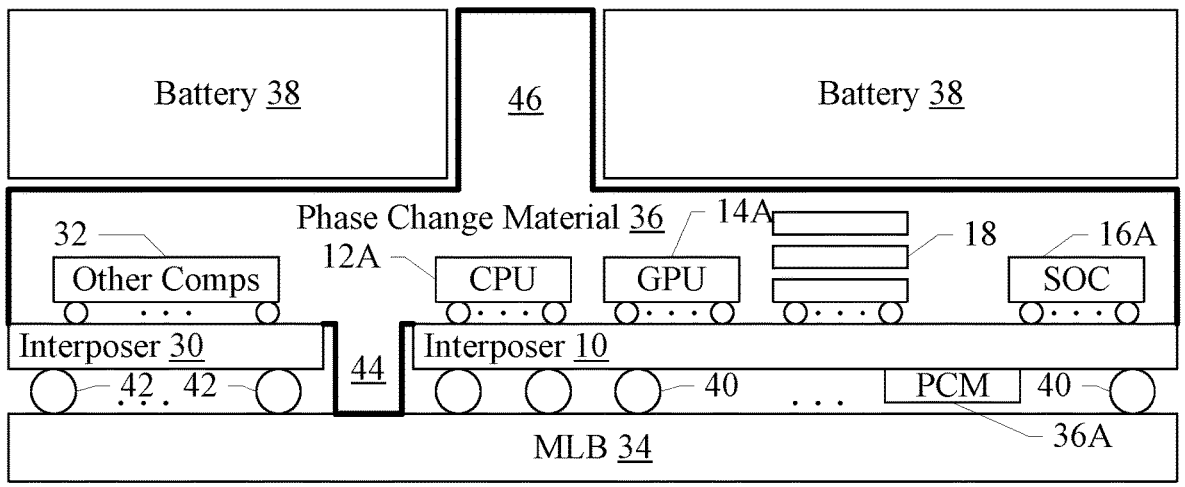
FIG. 4 is a side view of one embodiment of the interposer and other components on a main logic board (MLB).

FIG. 4 is a side view of one embodiment the interposer 10 (and also showing some of the components on the interposer 10, such as the CPU 12A, the GPU 14A, the memory 18, and the SOC portion 16A for an embodiment) in a main logic board (MLB) assembly. As previously mentioned, the CPU 12A, the GPU 14A, the memory 18, and the SOC portion 16A are coupled to a first surface of the interposer 10 (the top surface as illustrated in FIG. 4). An opposite surface of interposer 10 (the bottom surface as illustrated in FIG. 4) may have various solder balls 40 or other package pin connectors to couple the interposer 10 to an MLB 34. In the illustrated embodiment, a second interposer 30 is also included that couples to one or more other components (integrated circuits) 32 on one surface, e.g. the top surface of the second interposer 30 and the opposite surface (e.g. bottom surface) of the second interposer 30 includes solder balls 42 or other package pin connectors to couple the second interposer 30 to the MLB 34. A phase change material 36 is included in the illustrated embodiment. The boundary of the phase change material is illustrated with a heavy dark line in FIG. 4, except over the interposers 10 and 30 (which may be in contact with the phase change material 36, but the heavy line would obscure other features of the top surfaces of the interposers 10 and 30 and thus the heavy line is not shown in those areas). A battery 38 is illustrated above the MLB assembly in FIG. 4 as well.

When partitioning an "SOC" into multiple smaller ICs, at least some of which are high power, is that thermal mass may decrease near the high power areas, and thus the temperature rise may be steeper. The thermal mass of the interposer 10, or other thermal conduction devices such as a thermal lid or heat pipe, may effectively reduce the loss of thermal mass. Alternatively, the interposer 10 may add thermal mass (e.g. the various lower power chips stacked with high power chips mentioned above).

The phase change material 36 may act as a thermal interface material, and may cover the integrated circuits on the interposer 10. Alternatively or in addition, the phase change material may be included in the "low lying areas" between chips on the interposer 10 (e.g. in the gaps between chips shown in FIGS. 1-3). On the board, because of differences in the heights of active components and passive components, and also lateral spacing rules, there is unused space (or "free volume"). The PCM may be placed in this free volume, where it is safe to do so. The PCM may be a component, e.g. a passive capacitor) attached to the service, in some embodiments. In other embodiments, the PCM may be dispensed from a pen-like applicator to fill such areas and/or may be an adhesive material to be placed over the ICs. Combinations of various types of PCMs may be used. The phase change material may be in contact with the integrated circuits on the interposer 10 and may be in contact with the interposer 10 itself in the space between the integrated circuits. A phase change material may be any material with a high heat of fusion which is capable of storing and releasing large amounts of energy via melting and solidifying at a certain temperature. Heat is absorbed or released when the material changes from solid to liquid and vice versa. There are many types of phase change materials. One example may be paraffin or wax mixed with graphite to enhance thermal conductivity. Other thermal conductors than graphite may be used for thermal conductivity increase. Still further, in some embodiments, the phase change material may be built on a thermally conductive matrix. Additionally, the phase change material 36 may be a mixture that has a distributed melt range. Phase change material that is more pure tends to have a tight temperature distribution. For example, a distribution of paraffin wax with different carbon count molecules may have a distributed melt range. The mixture may provide some thermal mass over a larger temperature range, or at two or more points in the temperature range. Such a configuration may allow less frequent monitoring of the temperature and/or more time to react to temperature changes (e.g. by software executing in the system).

In the embodiment of FIG. 4, the phase change material 36 also covers the second interposer 30 and its integrated circuit(s) 32. In other embodiments, there may be no second interposer 30. However, in the illustrated embodiment, the phase change material 36 extends downward (as illustrated in FIG. 4) to contact the MLB 34 (reference numeral 44 in FIG. 4). Thus, an efficient heat conduction path to the MLB 34 may be formed. In cases where there is no second interposer 30, the phase change material 36 may optionally extend over one or more edges of the interposer 10 and down (e.g. to the right or left of the interposer 10 as illustrated in FIG. 4) to contact the MLB 34. Still further, in some embodiments, phase change material or other thermal mass may be included on an opposite side of the interposer 10 from the ICs (e.g. PCM 36A in FIG. 4). The PCM 36A may, in some embodiments, extend downward to contact the MLB 34.

In the embodiment of FIG. 4, the phase change material 36 may extend upward through space between battery cells 38 (or apertures formed in the battery 38) to provide a heat conduction path to the battery 38 and/or a portion of the device above the battery 38 (not shown in FIG. 4). For example, the area 46 in FIG. 4 may be an example of the phase change material 36 extended between/through the battery 38. In some cases, the aperture through the battery 38 may be formed by arranging multiple batteries around the aperture, rather than forming an aperture in a single battery. The battery 38 may be a thermal mass that may absorb heat energy conducted by the phase change material 36. Also, a heat sink or other heat conduction structure may be placed in contact with the area 46 above the battery 38, in some embodiments, to further conduct heat away from the assembly shown in FIG. 4. It is noted that battery 38 may be sensitive to heat, in some embodiments. The overall system design ensures that the battery 38 does not exceed thermal safety limits even when being used as a thermal mass. That is, the battery 38 itself generates heat when providing power to the system and/or when being charged. The combination of the self generated heat and any heat absorbed from the ICs on the interposer 10, is limited, by design, to ensure that battery safety limits are not exceeded. Additionally, other material such as the case may be used as a thermal mass, or battery internals such as electrode surfaces, or electrolytes etc, can be co-optimized with the main battery function, and thermal mass in mind. The case may be in contact with the battery 38 to carry heat away from the battery 38. Similarly, copper layers may be added to spread heat over a larger area, or heat pipes may be used, in contact with the phase change material 36, the battery 38, etc. in order to increase the thermal mass and spread the head as widely as feasible.

The second interposer 30 may include component(s) 32 that were not previously incorporated into an SOC. For example, various high frequency communication integrated circuits (e.g. "radio" chips, wifi chips, bluetooth chips, cell network interface chips, etc.). Alternatively, such chips may be on the interposer 10 as well, such as the analog chips 20A-20B.

Figure 5:
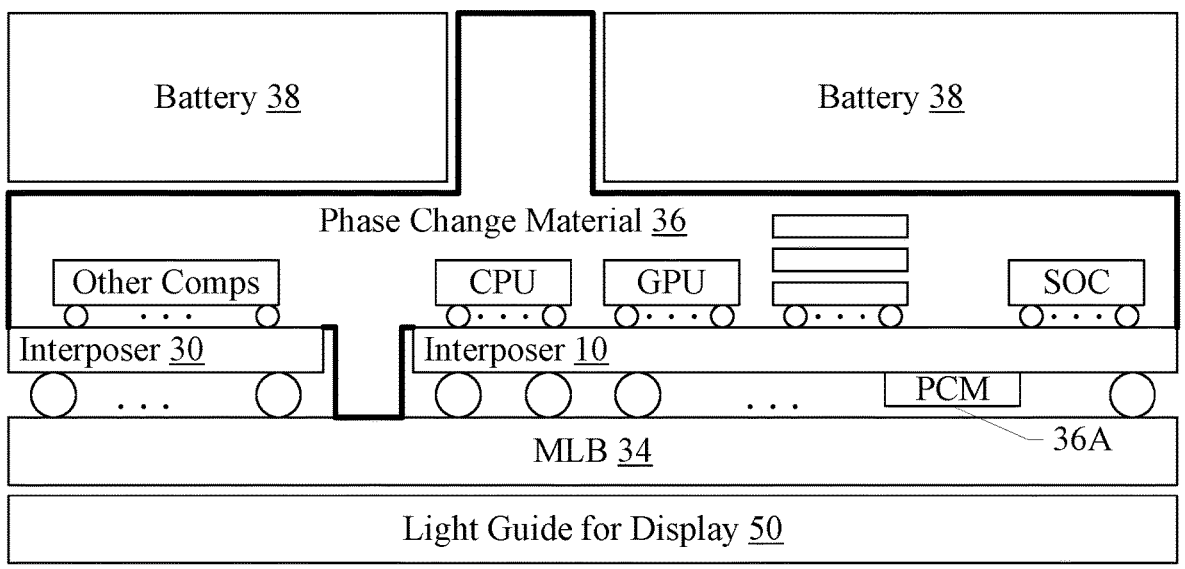
FIG. 5 is a side view of one embodiment of a system integration in which the MLB is formed on a light guide for a display.

While the embodiments illustrated in FIGS. 4 and 5 use solder bond connections, other embodiments may use more dense interconnects. For example, die may be placed with active transistor surfaces face-to-face and various attachments such as "direct oxide bond," "metal to metal bond," etc. may be sued to increase interconnect density and other properties. Also, face-to-back connections of various types may be used.

It is noted that, while various directional notations have been used in the above description with regard to the orientation of the elements of FIG. 4 (e.g. up, down, right, left, etc.), these directional notations are made for the illustrated orientation, and thus would change as the orientation of the assembly is changed. For example, if the assembly were inverted, the right and left references would interchange and the up and down references would interchange.

FIG. 5 is a side view of one embodiment of the assembly shown in FIG. 4 in which the MLB 34 is in contact with or proximate to a light guide 50 for a display in the device in which the assembly is used. In an embodiment, the MLB 34 may be formed by depositing layers onto the light guide 50, reducing the overall height of the light guide 50 and the assembly. Alternatively, the MLB 34 may be manufactured separately and attached to the light guide 50. That is, the light guide 50 may provide mechanical support for the MLB 34, which may allow the MLB 34 to be thinner than an MLB 34 that also provides mechanical support. Additionally, the light guide 50 may provide increased thermal mass. It is noted that the MLB 34 and the light guide 50 may differ in size, in some embodiments. For example, the MLB 34 may be smaller than the light guide 50. In other embodiments, the MLB 34 may be larger than the light guide 50. In an embodiment, the MLB 34 may be rectangular or somewhat square in form (when viewed from the surface to which the ICs attach). There may be more space for signals to be routed out of the ICs and MLB 34, and the MLB 34 may add to the thermal mass (e.g. the copper included in the MLB 34 may spread heat effectively).

In various embodiments, there may be one or more components of the display between the light guide 50 and the MLB 34. For example, a touch sensing layer may be between the light guide 50 and the MLB 34; or an alternative may be to place the touch sensing layer between light guide and the display. In an embodiment having a light emitting diode (LED) display, the LEDs may be attached to the MLB 34, surrounding the interposers 10 and 30, while the diffuser, polarizer and glass may be below the light guide. The light from the LEDs are optically coupled into the light guide. Numerous LEDs may be placed, which may improve brightness and uniformity on the display. Extra connectors and cables may be avoided, allowing more compact integration in some embodiments. In an embodiment using organic LED (OLED) display, the OLED substrate may be attached to the MLB 34 to provide mechanical stability. The OLED substrate attached to the MLB 34 may also increase the heat spreading, and may also increase the thermal mass to permit more "sprinting." Volume savings due to reduced overall height may applied to add additional thermal mass or battery, or the system may be made more compact, As with the discussion above with regard to FIG. 4, directional notations in the above description of FIG. 5 are with respect to the orientation of the components illustrated in FIG. 5 and would change if the orientation is changed.

Numerous variations and modifications will become apparent to those skilled in the art once the above disclosure is fully appreciated. It is intended that the following claims be interpreted to embrace all such variations and modifications.

What is claimed is:

1. An apparatus comprising:
   an interposer;
   a plurality of integrated circuits attached to a surface of the interposer, wherein:
      a subset of the plurality of integrated circuits are processors;
      the processors are distributed over the surface of the interposer; and
      other ones of the plurality of integrated circuits that are not processors are arranged between the processors, distributing a power consumption density of the plurality of integrated circuits over the surface;
   a phase change material in contact with the plurality of integrated circuits and the interposer, wherein the phase change material absorbs heat by melting and releases heat by solidifying during operation of the apparatus; and
   a battery in contact with the phase change material, wherein the battery includes one or more openings through which the phase change material extends to conduct heat away from the plurality of integrated circuits.

2. The apparatus as recited in claim 1 wherein at least one of the processors has a different leakage current than another one of the processors.

3. The apparatus as recited in claim 2, wherein high performance tasks are executed on a first processor of the processors, wherein the first processor has a higher leakage current during use, and wherein low performance tasks are executed on a second processor of the processors having a lower leakage current during use.

4. The apparatus as recited in claim 3 wherein a mix of high leakage current processors and low leakage current processors is selected responsive to a type of electronic device into which the apparatus is to be incorporated.

5. The apparatus as recited in claim 2 wherein at least one of the other ones of the plurality of integrated circuits has a different leakage current that another one of the other ones of the plurality of integrated circuits.

6. The apparatus as recited in claim 1 wherein the plurality of integrated circuits are arranged based on respective power densities of the plurality of integrated circuits, wherein a low power density integrated circuit is placed in proximity to a high power density integrated circuit.

7. The apparatus as recited in claim 1 further comprising a second interposer having one or more second integrated circuits arranged on the second interposer and in contact with the phase change material.

8. The apparatus as recited in claim 7 wherein the phase change material extends between the interposer and the second interposer to contact a main logic board to which the interposer and the second interposer are connected in a device.

9. An apparatus comprising:
a main logic board;
an interposer connected to the main logic board;
a plurality of integrated circuits attached to a surface of the interposer, wherein:
   a first subset of the plurality of integrated circuits are low leakage current devices;
   a second subset of the plurality of integrated circuits are high leakage current devices;
   the first subset is distributed over the surface of the interposer; and
   the second subset is arranged between instances of the first subset;
a phase change material coupled to the plurality of integrated circuits and increasing thermal mass in an area around the plurality of integrated circuits, wherein the phase change material absorbs heat by melting and releases heat by solidifying during operation of the apparatus; and
a second interposer connected to the main logic board, the second interposer having one or more second integrated circuits arranged on the second interposer and in contact with the phase change material; and
wherein the phase change material extends between the interposer and the second interposer to contact the main logic board.

10. The apparatus as recited in claim 9 wherein an arrangement of the first subset and the second subset spreads a power density of the plurality of integrated circuits over the surface of the interposer.

11. The apparatus as recited in claim 9 wherein at least one of the first subset is a first instance of a processor and at least one of the second subset is a second instance of the processor.

12. The apparatus as recited in claim 11 wherein the processor is a central processing unit.

13. The apparatus as recited in claim 11 wherein the processor is a graphics processing unit.

14. The apparatus as recited in claim 9 wherein at least one of the first subset is a first portion of a system on a chip design excluding processors from the design, and wherein at least one of the second subset is a second portion of the system on a chip design.

15. A device comprising:
a light guide for a display screen of the device;
a main logic board (MLB) attached to a surface of the light guide and in contact with the light guide, wherein the light guide mechanically supports the MLB;
an interposer coupled to the MLB;
a plurality of integrated circuits coupled to the interposer, wherein:
   a subset of the plurality of integrated circuits are processors; and
   the processors are distributed over the surface of the interposer; and
   other ones of the plurality of integrated circuits that are not processors are arranged between the processors, distributing a power consumption density of the plurality of integrated circuits over the surface of the interposer;
a second interposer coupled to the MLB, the second interposer having one or more second integrated circuits arranged on the second interposer; and
a phase change material in contact with the plurality of integrated circuits and the one or more second integrated circuits, wherein the phase change material absorbs heat by melting and releases heat by solidifying during operation of the device, and wherein the phase change material extends between the interposer and the second interposer to contact the MLB.

16. The device as recited in claim 15 further comprising a battery having one or more openings through which the phase change material extends to conduct heat away from the plurality of integrated circuits and the one or more second integrated circuits.

17. The device as recited in claim 15 wherein high performance tasks are executed on a first processor of the processors in the subset of the plurality of integrated circuits, wherein the first processor has a higher leakage current during use, and wherein low performance tasks are executed on a second processor of the processors in the subset of the plurality of integrated circuits, wherein the second processor has a lower leakage current during use.

18. The device as recited in claim 17 wherein the first processor and the second processor are central processing units in the device.

19. The device as recited in claim 17 wherein the first processor and the second processor are graphics processing units.

* * * * *